United States Patent
Viswanathan et al.

(10) Patent No.: US 10,375,833 B2
(45) Date of Patent: Aug. 6, 2019

(54) METHODS OF MANUFACTURING PACKAGED ELECTRONIC DEVICES WITH TOP TERMINATIONS

(71) Applicant: NXP USA, Inc., Austin, TX (US)

(72) Inventors: Lakshminarayan Viswanathan, Phoenix, AZ (US); Audel A. Sanchez, Tempe, AZ (US); Fernando A. Santos, Chandler, AZ (US); Jerry L. White, Glendale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/988,743

(22) Filed: May 24, 2018

(65) Prior Publication Data

US 2018/0270960 A1    Sep. 20, 2018

Related U.S. Application Data

(62) Division of application No. 14/549,934, filed on Nov. 21, 2014, now Pat. No. 9,986,646.

(51) Int. Cl.
*H05K 5/00* (2006.01)
*H05K 7/00* (2006.01)
(Continued)

(52) U.S. Cl.
CPC .............. *H05K 3/284* (2013.01); *H01L 21/56* (2013.01); *H01L 23/22* (2013.01); *H01L 23/28* (2013.01);
(Continued)

(58) Field of Classification Search
CPC .................. H05K 1/185; H05K 3/284; H05K 2201/10977; H05K 9/0081;
(Continued)

(56) References Cited

U.S. PATENT DOCUMENTS 6,961,245 B2 * 11/2005 Ikuta et al. ......... H01L 23/3677
361/719
9,450,547 B2    9/2016 Szymanowski et al.
(Continued)

FOREIGN PATENT DOCUMENTS

| CN | 102364683 A | 2/2012 |
| JP | 09-082880 | 3/1997 |
| JP | 10-200349 | 7/1998 |

OTHER PUBLICATIONS

Non Final Office Action dated Oct. 14, 2015 for U.S. Appl. No. 14/104,870, 23 pages.
(Continued)

*Primary Examiner* — Binh B Tran
(74) *Attorney, Agent, or Firm* — Sherry W. Schumm

(57) ABSTRACT

An embodiment of an electronic device includes a circuit component (e.g., a transistor or other component) coupled to the top surface of a substrate. Encapsulation is formed over the substrate and the component. An opening in the encapsulation extends from the encapsulation top surface to a conductive feature on the top surface of the component. A conductive termination structure within the encapsulation opening extends from the conductive feature to the encapsulation top surface. The device also may include a second circuit physically coupled to the encapsulation top surface and electrically coupled to the component through the conductive termination structure. In an alternate embodiment, the conductive termination structure may be located in a trench in the encapsulation that extends between two circuits that are embedded within the encapsulation, where the conductive termination structure is configured to reduce electromagnetic coupling between the two circuits during device operation.

22 Claims, 8 Drawing Sheets

(51) Int. Cl.
*H05K 1/18* (2006.01)
*H05K 3/28* (2006.01)
*H01L 21/56* (2006.01)
*H01L 33/52* (2010.01)
*H05K 9/00* (2006.01)
*H01L 31/0203* (2014.01)
*H01L 23/28* (2006.01)
*H01L 23/22* (2006.01)
*H01L 31/048* (2014.01)
*H05K 3/34* (2006.01)

(52) U.S. Cl.
CPC ........ *H01L 31/0203* (2013.01); *H01L 31/048* (2013.01); *H01L 33/52* (2013.01); *H01L 2224/04105* (2013.01); *H01L 2224/32225* (2013.01); *H01L 2224/32245* (2013.01); *H01L 2224/48137* (2013.01); *H01L 2224/73227* (2013.01); *H01L 2224/73267* (2013.01); *H01L 2224/92164* (2013.01); *H01L 2224/92244* (2013.01); *H05K 1/185* (2013.01); *H05K 3/3421* (2013.01); *H05K 9/0052* (2013.01); *H05K 9/0081* (2013.01); *H05K 2201/10166* (2013.01); *H05K 2201/10371* (2013.01); *H05K 2201/10977* (2013.01); *H05K 2203/1316* (2013.01); *H05K 2203/1327* (2013.01)

(58) Field of Classification Search
CPC ........ H05K 2201/10371; H05K 9/0052; H01L 23/28; H01L 21/56; H01L 31/0203; H01L 31/048; H01L 33/52; H01L 23/22
USPC ............... 361/761, 763, 764, 766, 783, 818; 174/251; 257/787, 788, 793, 678, 687
See application file for complete search history.

(56) References Cited

U.S. PATENT DOCUMENTS

2012/0247819 A1* 10/2012 Tsuyutani et al. ........................ H01L 23/5389
174/257
2019/0028063 A1 1/2019 Szymanowski et al.

OTHER PUBLICATIONS

Notice of Allowance and Fees Due; U.S. Appl. No. 15/267,455; 8 pages dated Jul. 20, 2018.
Notice of Allowance and Fees dated May 26, 2016 for U.S. Appl. No. 14/104,870, 7 pgs.
NFOA U.S. Appl. No. 16/141,686; 10 pages (dated Apr. 5, 2019).

* cited by examiner

METHODS OF MANUFACTURING PACKAGED ELECTRONIC DEVICES WITH TOP TERMINATIONS

CROSS-REFERENCE TO RELATED APPLICATION

This application is a divisional of co-pending, U.S. patent application Ser. No. 14/549,934, filed on Nov. 21, 2014.

TECHNICAL FIELD

Embodiments of the subject matter described herein relate generally to packaged electronic devices, and more particularly to overmolded electronic device packages.

BACKGROUND

A typical high power, radio frequency (RF) electronic device suitable for use in a power amplifier may include a substrate, one or more high power transistors coupled to the substrate, one or more input leads coupled to the transistor(s), and one or more output leads coupled to the transistor(s). In some cases, input and output impedance matching circuits also may be coupled to the substrate and contained within the same package as the device's transistor(s). More specifically, an in-package, input impedance matching circuit may be coupled to the substrate between a device's input lead and a control terminal (e.g., the gate) of a transistor, and an in-package, output impedance matching circuit may be coupled to the substrate between a current conducting terminal (e.g., the drain) of a transistor and a device's output lead. Typically, sets of wirebonds are used to provide electrical connections between the transistor(s), the input impedance matching circuit (if included), the output impedance matching circuit (if included), the input lead(s), and the output lead(s). The wirebonds may have significant inductances, and these inductances are factored into the design of the input and output impedance matching circuits.

An ever-present trend in the semiconductor industry is to reduce device size and cost. Accordingly, device engineers strive to develop packaged electronic devices, such as the one described above, that are relatively compact, while still achieving good system performance.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments include electronic devices (e.g., radio frequency (RF) electronic devices) implemented in overmolded packages. As will be discussed in more detail below, an embodiment of an electronic device includes at least one circuit component that is embedded in encapsulation (i.e., the device is embodied as an "overmolded" package), and at least one conductive termination structure within an opening in the encapsulation, where the conductive termination structure extends from a contact on the top surface of the component to the top surface of the encapsulation. For example, the electronic device may include at least one active device (e.g., a transistor), at least on input impedance matching circuit, and/or at least one output impedance matching circuit. One or more conductive termination structures may be coupled between components associated with any or all of these devices and/or circuits and a surface of encapsulation within which the devices and/or circuits are embedded.

Figure 1:
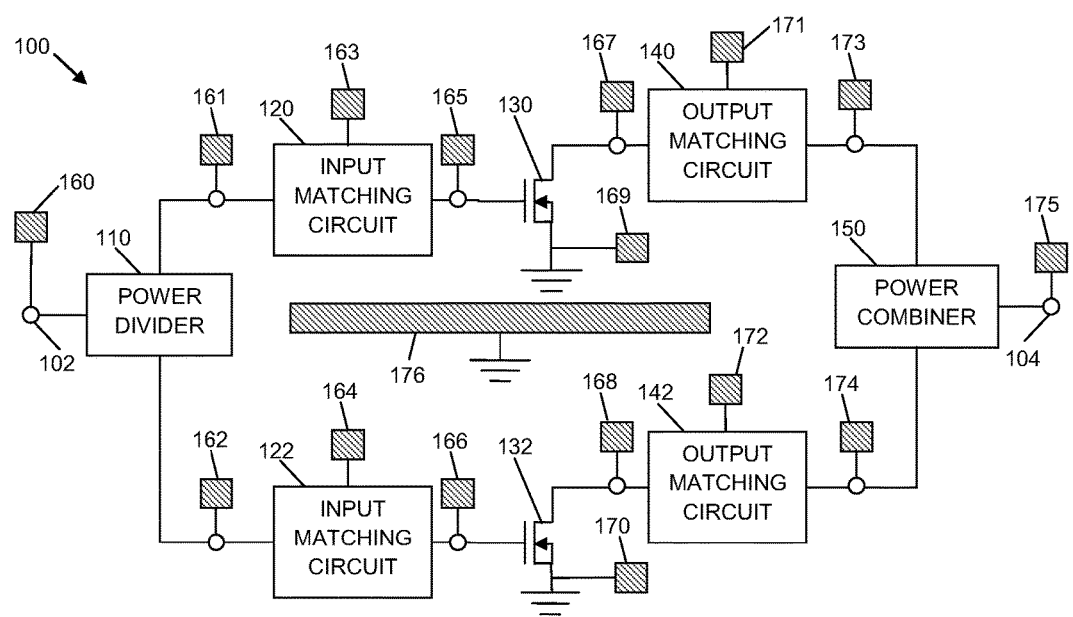
FIG. 1 is a schematic depiction of an embodiment of a multiple-path amplifier, portions of which may be implemented within an electronic device package, in accordance with an example embodiment.

Although the specification, below, describes examples of overmolded electronic devices that include portions of a multiple-path amplifier, it should be understood that embodiments of the inventive subject matter could be used in overmolded electronic devices that are included in a wide variety of electrical circuits. For example, although the amplifier described in conjunction with FIG. 1 is a two-path amplifier, embodiments of the inventive subject matter may be implemented in devices that are included in circuits other than amplifier circuits, and/or in amplifiers that have fewer or more than two amplifier paths. For example, embodiments may be implemented in devices that are included in single-path amplifiers, and/or amplifiers with more than two paths. Thus, the description of a particular amplifier and various elements of a particular amplifier, below, is not intended to limit the scope of the inventive subject matter only to the illustrated and described embodiments.

FIG. 1 is a schematic depiction of an embodiment of a multiple-path amplifier 100, portions of which may be implemented within an electronic device package (e.g., an overmolded device package). FIG. 1 further depicts multiple positions at which top termination structures 160-175 may be used to interconnect components embedded within the packaged device to circuitry that is external to the packaged device, in accordance with various example embodiments. FIG. 1 also depicts an additional top termination structure 176 used to isolate the multiple paths of the amplifier 100 from each other, in accordance with an embodiment. More specifically, top termination structure 176 may be configured to reduce electromagnetic coupling between the multiple amplification paths during operation of amplifier 100.

Amplifier 100 is a two-path amplifier (e.g., a Doherty amplifier or another type of two-path amplifier), which includes an input 102, a power divider 110, input impedance matching circuits 120, 122, transistors 130, 132, output impedance matching circuits 140, 142, a combiner 150, and an output 104, in an embodiment.

Input 102 is configured to enable the amplifier 100 to receive an input RF signal from external circuitry (not shown). Similarly, output 104 is configured to enable the amplifier 100 to provide other external circuitry (not shown) with an amplified version of the input RF signal.

Power divider 110 has an input coupled to input 102, and first and second divider outputs coupled to input impedance matching circuit 120, 122, respectively. The power divider 110 operates to divide or split an RF signal at input 102 into two signals, which are identical or very nearly identical signals (e.g., equal power), in some embodiments. This equal power form of power divider is often referred to as a 3 decibel (dB) divider since the resultant signals are each about 3 dB less than the signal at the input. While the 3 dB divider is typical, other dividers with multiple outputs or outputs with unequal signals could be used in other embodiments. Power divider 110 also may include one or more phase shift elements configured to shift the phase of the signals provided at either or both of the power divider outputs.

Each input impedance matching circuit 120, 122 is coupled between an output of power divider 110 and the control terminal (e.g., gate) of a transistor 130, 132. Input impedance matching circuits 120, 122 are configured to raise the impedance of each amplifier path at the outputs of power divider 110 to a higher (e.g., intermediate or higher) impedance level (e.g., in a range from about 2 to about 10 Ohms or higher). Each input impedance matching circuit 120, 122 may function as a low-pass filter, for example. According to an embodiment, each input impedance matching circuit 120, 122 may include one or more inductive elements (e.g., one or more sets of wirebonds or integrated inductors), and one or more shunt capacitors (e.g., discrete capacitors or integrated capacitors). Components of the input impedance matching circuits 120, 122 may or may not be implemented on the same die as transistors 130, 132.

Transistors 130, 132 are the primary active components of amplifier 100. Each of transistors 130, 132 includes a control terminal and two current conducting terminals, where the current conducting terminals are spatially and electrically separated by a variable-conductivity channel. For example, transistors 130, 132 may be a field effect transistors (FETs) (such as metal oxide semiconductor FETs (MOSFETs)), each of which includes a gate (control terminal), a drain (a first current conducting terminal), and a source (a second current conducting terminal). Alternatively, transistors 130, 132 may be bipolar junction transistors (BJTs). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of each transistor 130, 132 is coupled to an input impedance matching circuit 120, 122, the drain of each transistor 130, 132 is coupled to an output impedance matching circuit 140, 142, and the source of each transistor 130, 132 is coupled to a voltage reference node (e.g., ground). Through the variation of control signals provided to the gates of transistors 130, 132, the current between the current conducting terminals of each transistor 130, 132 may be modulated. Transistors 130, 132 may be implemented on a single die, or may be implemented on two separate die. In addition, in some embodiments, multiple transistors may be coupled in series along each amplification path (e.g., where a smaller transistor provides pre-amplification with relatively small gain, and a larger transistor applies significantly more gain to the signal being amplified).

Each output impedance matching circuit 140, 142 is coupled between the first current conducting terminal (e.g., drain) of a transistor 130, 132 and an input to power combiner 150. Each output impedance matching circuit 140, 142 is configured to match the output impedance of the transistor 130, 132 to which it is connected with the input impedance power combiner 150 and/or an external circuit (not shown) to which the output 104 of amplifier 100 is coupled. Each output impedance matching circuit 140, 142 may function as a high-pass and/or low-pass filter, for example. Each output impedance matching circuit 140, 142 includes one or more inductive elements (e.g., one or more sets of wirebonds or integrated inductors), and one or more shunt capacitors (e.g., discrete capacitors or integrated capacitors). Components of the output impedance matching circuits 140, 142 may or may not be implemented on the same die as transistors 130, 132.

Power combiner 150 includes two inputs coupled to output impedance matching circuits 140, 142, respectively, and an output coupled to amplifier output 104. Power combiner 150 operates to combine the amplified RF signals produced by the output impedance matching circuits 140, 142 into a single RF signal. To compensate for phase shift(s) that may have been applied by power divider 110, and in order to ensure that the amplified RF signals are combined in phase, power combiner 150 also may include one or more phase shift elements configured to shift the phase of the signals provided at either or both of the power combiner inputs.

According to various embodiments, some or all circuits and components of amplifier 100 may be embedded in an overmolded electronic device (or encapsulated), where any circuits and/or components that are not embedded within the overmolded electronic device may be included on a printed circuit board (PCB) or other substrate to which the overmolded electronic device is coupled. As will be described in more detail below, the overmolded electronic device further may include one or more "conductive termination structures" or "top terminations" (e.g., structures 160-176), which are conductive structures that electrically couple conductive features of embedded circuits and components with a surface of the encapsulation that overlies the conductive features. Although reference is made herein to "top terminations" or conductive termination structures that extend to the "top surface" of the encapsulation or device, the use of the term "top" is not meant to imply any particular surface or orientation of the device. Instead, the term "top surface" means a surface of the encapsulation that overlies an embedded circuit or component, and a "top termination" means a conductive termination structure that extends to the "top surface." In some cases, the top surface may be substantially parallel with the surface of a component to which a conductive termination structure is coupled. In other cases, the top surface may be orthogonal to the surface of a component to which a conductive termination structure is coupled, or the conductive feature to which the conductive termination structure is coupled may not have a planar surface.

An embedded component may include, for example, a discrete component, a semiconductor die, a conductive feature that provides a voltage reference or signal path (e.g., a wirebond, conductive trace, conductive layer, flange, interposer, PCB, and so on). In some cases, a component may be completely embedded (e.g., completely surrounded by encapsulation and other device features), and in other cases a component may be only partially embedded (e.g., partially surrounded by encapsulation and other device features). According to an embodiment, each conductive termination structure is located within an opening in the encapsulation, which extends from a conductive feature of a component to a surface of the encapsulation (e.g., from a contact pad or other conductive feature to the top surface of the encapsulation).

For example, referring again to FIG. 1, substantially all of the components of amplifier 100 may be embedded within an overmolded electronic package, in an embodiment, although fewer than all of the components of amplifier 100 may be embedded within an overmolded electronic package, in other embodiments. Assuming that all components of amplifier 100 are embedded within an overmolded electronic package, FIG. 1 depicts a plurality of possible positions at which conductive termination structures 160-176 may be positioned. It should be understood that conductive termination structures 160-176 may be excluded from any of these possible positions, as well. More specifically, in embodiments in which fewer than all of the components of amplifier 100 are embedded within an overmolded electronic package, those of the conductive termination structures 160-176 that are not coupled to an embedded component would be excluded from the amplifier 100. For example, in an embodiment in which only transistors 130, 132 are embedded within an overmolded electronic package, the overmolded electronic package may include only conductive termination structures 165-170 (and possibly conductive termination structure 176), and the other conductive termination structures may be excluded.

In an embodiment in which all of the components and circuits of amplifier 100 are embedded within an overmolded electronic device, conductive termination structure 160 may couple input 102 to a surface of the device, conductive termination structures 161, 162 may couple outputs of power divider 110 (or inputs to input impedance matching circuits 120, 122) to a surface of the device, conductive termination structures 163, 164 may couple components of the input impedance matching circuits 120, 122 to a surface of the device, conductive termination structures 165, 166 may couple outputs of the input impedance matching circuits 120, 122 (or gate contacts of transistors 130, 132) to a surface of the device, conductive termination structures 167, 168 may couple first current conducting terminal contacts (e.g., drain contacts) of transistors 130, 132 (or inputs to output impedance matching circuits 140, 142) to a surface of the device, conductive termination structures 169, 170 may couple second current conducting terminal contacts (e.g., source contacts) to a surface of the device, conductive termination structures 171, 172 may couple components of the output impedance matching circuits 140, 142 to a surface of the device, conductive termination structures 173, 174 may couple outputs of output impedance matching circuits 140, 142 (or inputs to power combiner 150) to a surface of the device, and conductive termination structure 175 may couple output 104 to a surface of the device.

Further, in an embodiment, a conductive termination structure 176 may couple an embedded voltage reference node (e.g., a ground node) of the device to a surface of the device. According to an embodiment, such a conductive termination structure 176 may be used to provide electrical access to the voltage reference node from the top surface of the device, or to isolate multiple circuits of the device from each other. For example, as depicted in FIG. 1, conductive termination structure 176 may be arranged and configured to isolate one amplification path (e.g., including transistor 130) from an adjacent amplification path (e.g., including transistor 132). Other conductive termination structures (not shown in FIG. 1) may be used to isolate or shield other circuits of the device. For example, in an alternate embodiment, a conductive termination structure may be arranged and configured to isolate input circuits (e.g., input matching circuits 120, 122) from output circuits (e.g., output matching circuits 140, 142).

As stated above, FIG. 1 depicts a plurality of possible positions at which conductive termination structures 160-176 may be positioned. In various embodiments, some of the conductive termination structures 160-176 may be excluded, and/or other conductive termination structures (not shown) may be coupled to other components or portions of a circuit. For example, although transistor bias circuitry is not illustrated in FIG. 1, an alternate embodiment of an amplifier circuit may include transistor bias circuitry, and one or more conductive termination structures may be coupled to the transistor bias circuitry, for example, to provide a bias voltage. As also indicated above, the conductive termination structures included within a device are partially determined based on which components are included within the device. FIGS. 2-8 illustrate various embodiments of packaged electronic devices with various combinations of components and conductive termination structures.

Figure 2:
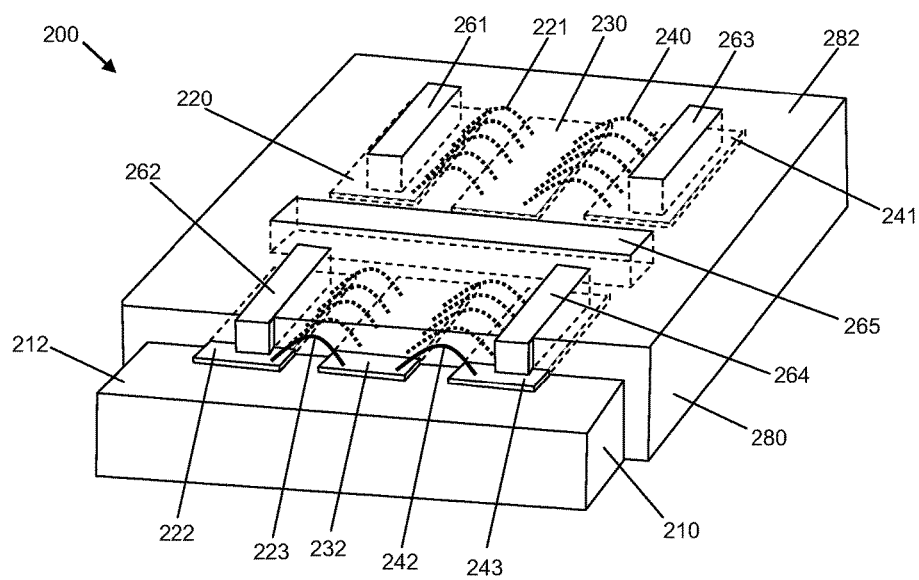
FIG. 2 is a partially cut-away view of a packaged electronic device with top terminations, in accordance with an example embodiment.

For example, FIG. 2 is a partially cut-away view of a packaged electronic device 200 with top terminations (or conductive termination structures) 261-265, in accordance with an example embodiment. The packaged electronic device 200 includes various components and circuits corresponding to portions of a multi-path amplifier (e.g., amplifier 100, FIG. 1). More specifically, die 220, 230, 241 and wirebonds 221, 240 correspond to portions of a first amplification path, and die 222, 232, 243 and wirebonds 223, 242 correspond to portions of a second amplification path, as will be explained in more detail below.

Device 200 includes a substrate 210 to which other components and elements of device 200 are coupled. Substrate 210 is a rigid electrically-conductive component, which has a thickness that is sufficient to provide structural support for other components and elements of device 200 that are coupled to substrate 210. In addition, substrate 210 may function as a heatsink for transistor die 230, 232 and other devices mounted on substrate 210. In such an embodiment, a system substrate (e.g., a PCB) to which device 200 ultimately is mounted may include a structure (e.g., a conductive coin or other structure) that contacts substrate 210, and which is configured to absorb heat from substrate 210. In an alternate embodiment, substrate 210 may be formed from one or more layers of dielectric material and a plurality of conductive layers. For example, substrate may be a ball grid array (BGA) substrate that includes conductive pads on its top and bottom surfaces, and conductive vias (and possibly one or more interior conductive layers) electrically connecting the top and bottom conductive pads. In such an embodiment, components of the device may be flip-chip bonded or wirebonded to the conductive pads on the top surface of the BGA substrate. In another alternate embodiment, device 200 may be implemented in a fan out wafer level (FOWL) package configuration. In such an embodiment, substrate 210 may include a plurality of conductive routing layers interconnected by conductive vias through one or more dielectric layers, where the plurality of conductive and dielectric layers and vias are formed over exposed contact surfaces of the device components after those components are embedded within encapsulation (e.g., encapsulation 280).

Substrate 210 has a conductive top surface 212, and may be formed entirely from a bulk conductive material, in an embodiment. Alternatively, and as indicated above, substrate 210 may have one or more layers of non-conductive and conductive material below its top surface. When substrate 210 is implemented as a BGA substrate, for example, the conductive top surface 212 may be a patterned conductive layer that includes conductive contact pads. Alternatively, in a FOWL embodiment, the "conductive top surface" of substrate 210 refers to the ends of conductive vias that are coupled with exposed contact pads of the electrical components embedded within the encapsulation 280. Either way, when device 200 is incorporated into a larger electrical system, substrate 210 may be used at least to provide a voltage reference (e.g., a ground reference) for the device 200. For example, die 220, 222, 230, 232, 241, 243 and/or other components and elements of the device 200 may have terminals that are electrically coupled to substrate 210, and substrate 210 may be electrically coupled to a system ground. In BGA and FOWL embodiments, power and signals also may be communicated through substrate 210.

First and second input-side die 220, 222, first and second transistor die 230, 232, and first and second output-side die 241, 243, each are coupled to the top substrate surface 212. Die 220, 222, 230, 232, 241, 243 may include any combination of silicon die, gallium nitride die, gallium arsenide die, compound die (e.g., silicon-on-sapphire, and so on), or die implemented using other semiconductor materials.

Device 200 further includes first sets of wirebonds 221, 223 electrically coupling the input-side die 220, 222 with gate contacts (not illustrated) of transistor die 230, 232, and second sets of wirebonds 240, 242 electrically coupling current conducting terminals (e.g., drain terminals) of transistor die 230, 232 with output-side die 241, 243. For example, each input-side die 220, 222 may include one or more components (e.g., integrated capacitors and/or inductors) of an input impedance matching circuit (e.g., input impedance matching circuits 120, 122, FIG. 1), and the first sets of wirebonds 221, 223 may correspond to an inductive component of each input impedance matching circuit. Similarly, each output-side die 241, 243 may include one or more components (e.g., integrated capacitors and/or inductors) of an output impedance matching circuit (e.g., output impedance matching circuits 140, 142, FIG. 1), and the second sets of wirebonds 240, 242 may correspond to an inductive component of each output impedance matching circuit.

The top substrate surface 212, input-side die 220, 222, transistor die 230, 232, output-side die 241, 243, and wirebonds 221, 223, 240, 242 are embedded within encapsulation 280 of the device 200, which is shown partially cut-away to better depict the substrate top surface 212 and coupling of the embedded components to the substrate top surface 212. In FIG. 2, dashed lines are used to indicate the boundaries of components and features that are embedded within encapsulation 280. Encapsulation 280 comprises cured, non-conductive molding compound, which surrounds the wirebonds 221, 223, 240, 242 and top and side surfaces of the die 220, 222, 230, 232, 241, 243. Encapsulation 280 has a top encapsulation surface 282, which is substantially parallel with the top substrate surface 212 and the top surfaces of die 220, 222, 230, 232, 241, 243.

According to an embodiment, device 200 also includes a plurality of conductive termination structures or "top terminations" 261, 262, 263, 264, which are connected to and extend from conductive features (e.g., die pads) on the top surfaces of die 220, 222, 241, 243 to the top encapsulation surface 282. In addition, device 200 includes an additional top termination 265, which is connected to and extends from the conductive top substrate surface 212 to the top encapsulation surface 282. Top termination 265 may be positioned in a trench-shaped opening in the encapsulation 280, for example. Each of the top terminations 261-265 has a surface that is exposed at the top encapsulation surface 282, which enables external circuitry (not shown) to be electrically coupled to the top terminations 261-265, and thus to the die 220, 222, 241, 243 or substrate 210 to which the top terminations 261-265 are coupled. As such, each top termination 261-265 may perform the same function as a conventional lead (i.e., to electrically couple external circuitry to circuitry within the device 200), which results in device 200 being configured as a "leadless" device. According to an embodiment, each top termination 261-265 extends orthogonally from the conductive feature to which it is coupled to the top encapsulation surface 282.

According to an embodiment, top terminations 261, 262 each are coupled to an input of an input matching circuit (e.g., top terminations 261, 262 correspond to conductive termination structures 161, 162 at inputs to input matching circuits 120, 122, FIG. 1). Similarly, top terminations 263, 264 each are coupled to an output of an output matching circuit (e.g., top terminations 263, 264 correspond to conductive termination structures 173, 174 at outputs of output matching circuits 140, 142, FIG. 1). For example, each input-side and output-side die 220, 222, 241, 243 may include a shunt capacitor, and top terminations 261-264 each may be coupled to a conductive die pad on the top surface of each input-side and output-side die 220, 222, 241, 243, where each die pad, in turn, is electrically coupled with a first electrode of the shunt capacitor. The second electrode of each shunt capacitor may be coupled to the conductive top substrate surface 212, and thus to ground. In the embodiment illustrated in FIG. 2, each of the conductive die pads are elongated pads, and thus top terminations 261-264 each comprise elongated conductive features (e.g., trench or bar shaped features). In other embodiments, the conductive die pads may be smaller, and/or multiple conductive die pads may be implemented on each die 220, 222, 241, 243. In such embodiments, the top terminations 261-264 may have different physical configurations that better conform to the smaller die pads, and/or more than one top termination may be coupled to each die 220, 222, 241, 243. In addition, although the figures illustrate elongated top terminations (e.g., trench-shaped top terminations), other embodiments may include top terminations in the form of filled vias with circular, oval, rectangular, or other cross-sectional shapes. Further, multiple top terminations may contact any particular embedded conductive feature.

Top termination 265 is coupled to the top substrate surface 212 between the components associated with the two amplification paths. According to an embodiment, top termination 265 is physically configured to eliminate (or at least substantially reduce) electromagnetic coupling between the two amplification paths during operation, thus providing better isolation of the amplification paths from each other. For example, top termination 265 is essentially configured as a conductive wall that extends across substantially the entire length of the two amplification paths. In an alternate embodiment, top termination 265 may be used simply to enable an external voltage reference (e.g., ground) to be coupled to the top substrate surface 212, in which case top termination 265 may be smaller than is depicted in FIG. 2, and/or top termination 265 may be located in a different position.

According to an embodiment, each top termination 261-265 is a solid conductive structure that may be formed from one or more conductive materials. For example, and as will be described in more detail later in conjunction with FIGS. 9-13, some or all of the top terminations 261-265 may be formed from a bulk conductive material that is deposited in openings in the encapsulation 280 that have the shapes of the top terminations 261-265. Alternatively, some or all of the top terminations 261-265 may be formed by plating the openings in the encapsulation 280, and performing one or more conductive material deposition processes to form the bulk of the top terminations 261-265. In an alternate embodiment, and as will be described in more detail later in conjunction with FIGS. 14-16, some or all top terminations 261-265 may include a solid conductive feature that is connected to the die pads and/or top substrate surface 212 before the device 200 is encapsulated.

Figure 3:
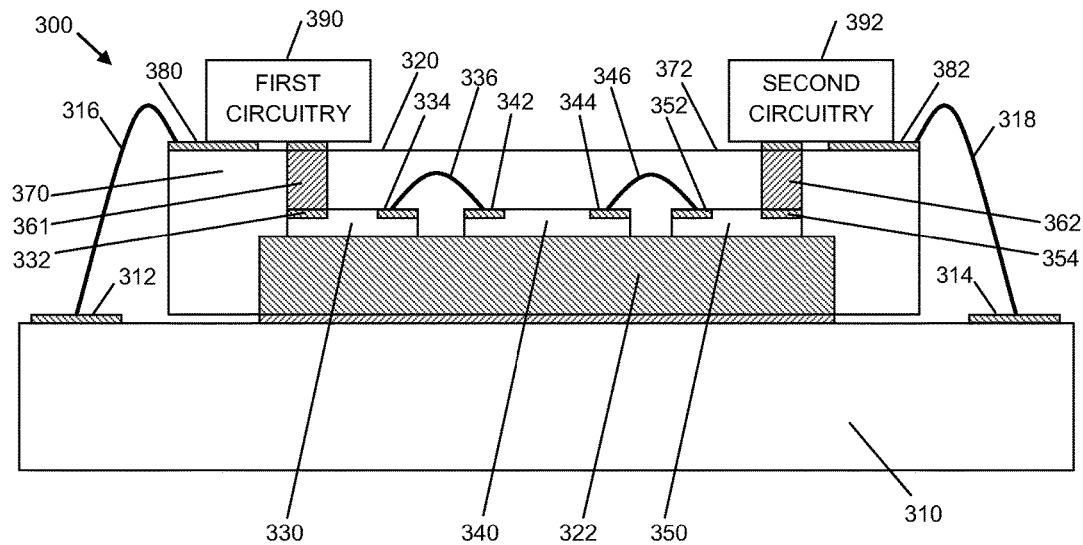
FIGS. 3-8 are cross-sectional, side views of various embodiments of electronic devices that include top terminations, and which are coupled to external circuitry, in accordance with various example embodiments.

FIGS. 3-8 are cross-sectional, side views of various embodiments of electronic devices that include top terminations, and which are coupled to external circuitry. For example, FIG. 3 is a cross-sectional, side view of a system 300 that includes a system substrate 310 (e.g., a PCB) to which an electronic device 320 with top terminations 361, 362 is coupled, in accordance with an example embodiment. More specifically, device 320 includes a substrate 322, a plurality of die 330, 340, 350, wirebonds 336, 346, the top terminations 361, 362, and encapsulation 370.

Substrate 322 may be similar to substrate 210 (FIG. 2), for example, in that substrate 322 includes a conductive top surface, and the conductive top surface may provide a voltage reference (e.g., a ground reference) for the device 320. In addition, substrate 322 may function as a heatsink for the device 320. In such an embodiment, system substrate 310 may include a structure (e.g., a conductive coin or other structure, not shown) that contacts substrate 322, and which is configured to absorb heat from substrate 322.

The die 330, 340, 350 each is coupled to the top surface of device substrate 322. For example, the die 330, 340, 350 may form portions of an amplification path, with die 330 being an input-side die (e.g., die 220, FIG. 1) that includes one or more input impedance matching components (e.g., a shunt capacitor and/or other components), die 340 being a transistor die (e.g., die 230, FIG. 2), and die 350 being an output-side die (e.g., die 241, FIG. 2) that includes one or more output impedance matching components (e.g., a shunt capacitor and/or other components). Wirebonds 336, which may form an inductive component of the input impedance matching circuit, electrically couple a conductive die pad 334 at the top surface of input-side die 330 with a conductive die pad 342 at the top surface of transistor die 340. Die pad 342 may electrically connect to a control terminal (e.g., a gate terminal) of the transistor embodied in transistor die 340, for example. Wirebonds 346, which may form an inductive component of the output impedance matching circuit, electrically couple a conductive die pad 344 at the top surface of transistor die 340 with a conductive die pad 352 at the top surface of output-side die 350. Die pad 344 may electrically connect to a current conducting terminal (e.g., a drain terminal) of the transistor embodied in transistor die 340, for example.

Top terminations 361, 362 extend from conductive die pads 332, 354 at the top surfaces of input-side and output-side die 330, 350, respectively, to the top surface 372 of encapsulation 370. Accordingly, the exposed surfaces of top terminations 361, 362 function as input and output nodes for the circuitry embedded in device 320. According to an embodiment, the height of the top terminations 361, 362 (and the height of encapsulation 370) are minimized so that the inductances of the top terminations 361, 362 are low. For example, the height of the top terminations 361, 362 (and the height of encapsulation 370) may be selected to be just slightly higher than the highest circuit component (e.g., slightly higher than the height of wirebonds 336, 346). Minimizing the height and inductance of top terminations 361, 362 may be particularly advantageous in high frequency RF applications, in which such inductances may have a significant effect on performance and/or device design.

According to an embodiment, and as illustrated in FIG. 3, circuitry may be physically coupled to the top surface 372 of the encapsulation 370, and electrically coupled to the circuitry embedded in device 320 through top terminations 361, 362. For example, first circuitry 390 may be coupled between a conductive input structure 380 and top termination 361, and second circuitry 392 may be coupled between top termination 362 and a conductive output structure 382. The first and second circuitry 390, 392 may include any of a variety of electrical components that are suitable for being formed on or attached to the top surface 372 of the encapsulation 370. For example, the first and second circuitry 390, 392 may include discrete electrical components (e.g., capacitors, inductors, resistors, and so on), additional integrated circuit die, transmission lines, small PCBs, and so on. For example, first circuitry 390 may include a power divider (e.g., power divider 110, FIG. 1), additional passive components of an input impedance matching circuit, bias circuitry, a phase shifter, an attenuator, a processing component, and so on. Similarly, second circuitry 392 may include a power combiner (e.g., power combiner 150, FIG. 1), additional passive components of an output impedance matching circuit, bias circuitry, a phase shifter, an attenuator, a processing component, and so on.

The conductive input and output structures 380, 382 at the top surface 372 of encapsulation 370 are electrically coupled to conductive structures 312, 314 at the top surface of the system substrate 310. For example, as illustrated in FIG. 3, the conductive input and output structures 380, 382 may be coupled to conductive structures 312, 314 using wirebonds 316, 318. In other embodiments, the device 320 and/or first and second circuitry 390, 392 may be electrically coupled to conductive structures 312, 314 using other means (e.g., wrap-around terminations, as in FIG. 5, or leads, as in FIG. 6).

Figure 4:
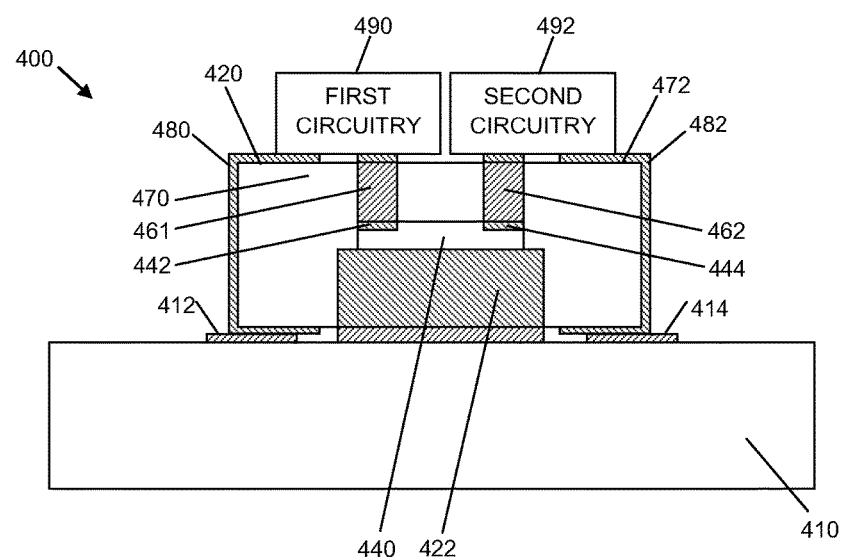

FIG. 4 is a cross-sectional, side view of a system 400 that includes a system substrate 410 (e.g., a PCB) to which an electronic device 420 with top terminations 461, 462 is coupled, in accordance with another example embodiment. More specifically, device 420 includes a substrate 422, a die 440, the top terminations 461, 462, and encapsulation 470.

Once again, substrate 422 includes a conductive top surface, and the conductive top surface may provide a voltage reference (e.g., a ground reference) for the device 420. In addition, substrate 422 may function as a heatsink for the device 420. In such an embodiment, system substrate 410 may include a structure (e.g., a conductive coin or other structure, not shown) that contacts substrate 422, and which is configured to absorb heat from substrate 422.

The die 440 is coupled to the top surface of device substrate 422. For example, the die 440 may form a portion of an amplification path, with die 440 being a transistor die (e.g., die 230, FIG. 2). Top terminations 461, 462 extend from conductive die pads 442, 444 at the top surface of die 440 to the top surface 472 of encapsulation 470. Accordingly, the top surfaces of top terminations 461, 462 function as input and output nodes for the circuitry embedded in device 420.

According to an embodiment, and as illustrated in FIG. 4, circuitry may be physically coupled to the top surface 472 of the encapsulation 470, and electrically coupled to the circuitry embedded in device 420 through top terminations 461, 462. For example, first circuitry 490 may be coupled between a conductive input structure 480 and top termination 461, and second circuitry 492 may be coupled between top termination 462 and a conductive output structure 482. The first and second circuitry 490, 492 may include any of a variety of electrical components that are suitable for being formed on or attached to the top surface 472 of the encapsulation 470. For example, the first and second circuitry 490, 492 may include discrete electrical components (e.g., capacitors, inductors, resistors, and so on), additional integrated circuit die, transmission lines, small PCBs, and so on. For example, first circuitry 490 may include various passive components of an input impedance matching circuit (e.g., input impedance matching circuit 120, FIG. 1). In addition or alternatively, first circuitry 490 may include a power divider (e.g., power divider 110, FIG. 1), bias circuitry, a phase shifter, an attenuator, a processing component, and so on. Similarly, second circuitry 492 may include various passive components of an output impedance matching circuit (e.g., output impedance matching circuit 140, FIG. 1). In addition or alternatively, second circuitry 492 may include a power combiner (e.g., power combiner 150, FIG. 1), bias circuitry, a phase shifter, an attenuator, a processing component, and so on.

The conductive input and output structures 480, 482, which are coupled to the first and second circuitry 490, 492 at the top surface 472 of encapsulation 470, may include wrap-around terminations, which are electrically coupled to conductive structures 412, 414 at the top surface of the system substrate 410, as shown. In other embodiments, the device 420 and/or first and second circuitry 490, 492 may be electrically coupled to conductive structures 412, 414 using other means (e.g., wirebonds, as in FIG. 3, or leads, as in FIG. 6).

Figure 5:
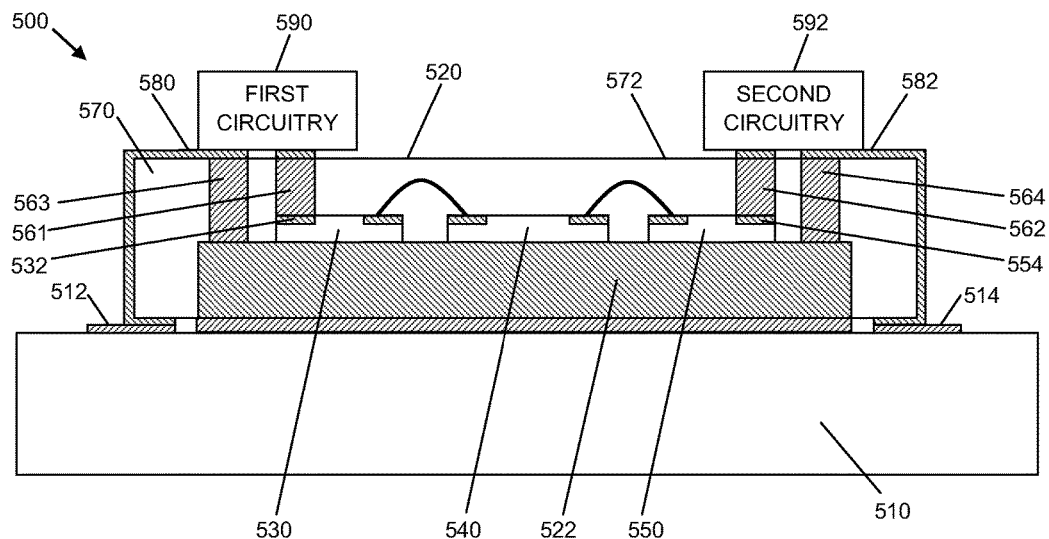

FIG. 5 is a cross-sectional, side view of a system 500 that includes a system substrate 510 (e.g., a PCB) to which an electronic device 520 with top terminations 561-564 is coupled, in accordance with yet another example embodiment. Similar to the device 300 of FIG. 3, device 520 includes a substrate 522, a plurality of die 530, 540, 550, wirebonds 536, 546, the top terminations 561, 562, and encapsulation 570. The characteristics and functionality of each of these components may be identical or substantially similar to the analogous components in device 300 of FIG. 3. For brevity, those characteristics and functionality will not be repeated.

The system 500 of FIG. 5 differs from the system 300 of FIG. 3, in that the device 520 includes top terminations 563, 564 extending from the top surface of device substrate 522 to the top surface 572 of encapsulation 570, as well as top terminations 561, 562 extending from conductive die pads 532, 554 at the top surfaces of input-side and output-side die 530, 550. Accordingly, not only can the top surfaces of top terminations 561, 562 function as input and output nodes for the circuitry embedded in device 520, but a voltage reference (e.g., ground) can be provided by external circuitry to the top surface of device substrate 522.

As also illustrated in FIG. 5, circuitry may be physically coupled to the top surface 572 of the encapsulation 570, and electrically coupled to the device substrate 522 and to circuitry embedded in device 520 through top terminations 561-564. As discussed previously, the first and second circuitry 590, 592 may include any of a variety of electrical components that are suitable for being formed on or attached to the top surface 572 of the encapsulation 570.

Conductive structures 580, 582, which are coupled to the first and second circuitry 590, 592 at the top surface 572 of encapsulation 570, may include wrap-around terminations, which are electrically coupled to conductive structures 512, 514 at the top surface of the system substrate 510, as shown. In other embodiments, the device 520 and/or first and second circuitry 590, 592 may be electrically coupled to conductive structures 512, 514 using other means (e.g., wirebonds, as in FIG. 3, or leads, as in FIG. 6).

Figure 6:
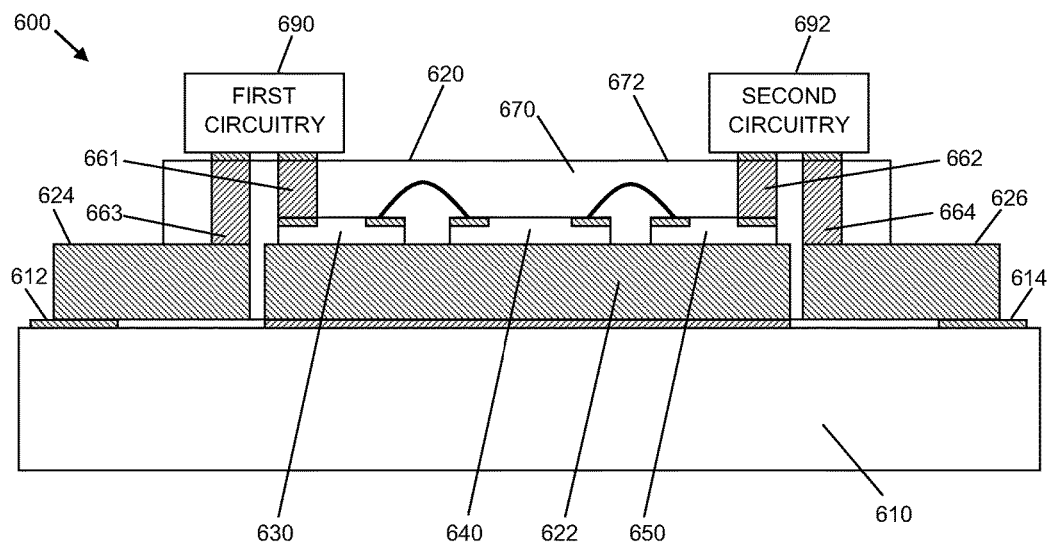

FIG. 6 is a cross-sectional, side view of a system 600 that includes a system substrate 610 (e.g., a PCB) to which an electronic device 620 with top terminations 661-664 is coupled, in accordance with yet another example embodiment. Similar to the devices 300, 500 of FIGS. 3 and 5, device 620 includes a substrate 622, a plurality of die 630, 640, 650, wirebonds 636, 646, the top terminations 661, 662, and encapsulation 670. The characteristics and functionality of each of these components may be identical or substantially similar to the analogous components in devices 300, 500 of FIGS. 3 and 5. For brevity, those characteristics and functionality will not be repeated.

The system 600 of FIG. 6 differs from the systems 300, 500 of FIGS. 3 and 5, in that the device 620 includes input and output leads 624, 626 and top terminations 663, 664 extending from the top surface of the input and output leads 624, 626 to the top surface 672 of encapsulation 670. Accordingly, leads 624, 626 can function as input and output nodes for the circuitry embedded in device 620. In addition, leads 624, 626 may be electrically coupled to conductive structures 612, 614 at the top surface of the system substrate 610, as shown.

According to an embodiment, device substrate 622 and leads 624, 626 may form portions of a leadframe, which holds the device substrate 622 and leads 624, 626 in fixed orientations with respect to each other, prior to encapsulation. Although straight leads 624, 626 that are co-planar with the device substrate 622 are illustrated in FIG. 6, gull wing leads or leads with other shapes alternatively may be used. In addition, the leads may not be co-planar with the device substrate, in alternate embodiments.

As also illustrated in FIG. 6, circuitry may be physically coupled to the top surface 672 of the encapsulation 670, and electrically coupled to the leads 624, 626 and to circuitry embedded in device 620 through top terminations 661-664. As discussed previously, the first and second circuitry 690, 692 may include any of a variety of electrical components that are suitable for being formed on or attached to the top surface 672 of the encapsulation 670.

Figure 7:
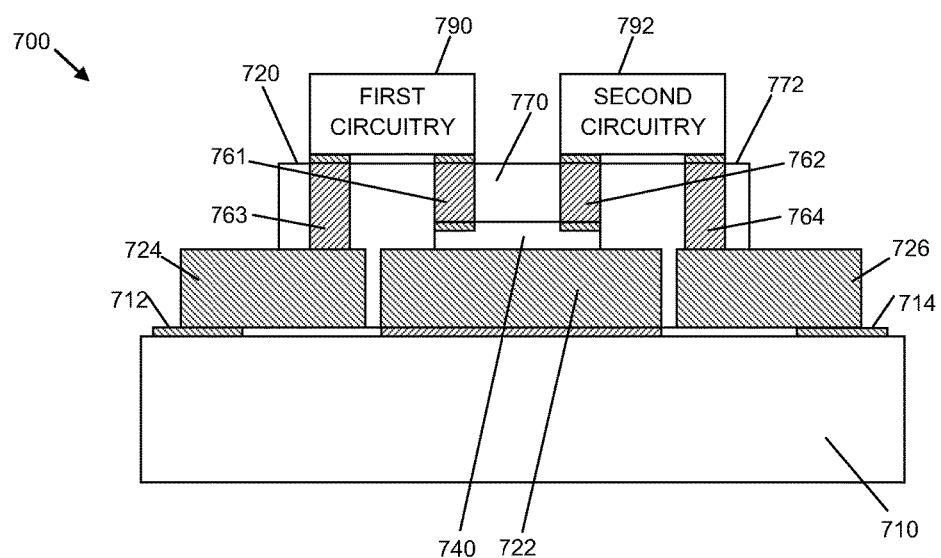

FIG. 7 is a cross-sectional, side view of a system 700 that includes a system substrate 710 (e.g., a PCB) to which an electronic device 720 with top terminations 761-764 is coupled, in accordance with yet another example embodiment. Similar to the device 400 of FIG. 4, device 720 includes a substrate 722, a die 740, the top terminations 761, 762, and encapsulation 770. The characteristics and functionality of each of these components may be identical or substantially similar to the analogous components in device 400 of FIG. 4. For brevity, those characteristics and functionality will not be repeated.

The system 700 of FIG. 7 differs from the system 400 of FIG. 4, in that the device 720 includes input and output leads 724, 726 and top terminations 763, 764 extending from the top surface of the input and output leads 724, 726 to the top surface 772 of encapsulation 770. Accordingly, leads 724, 726 can function as input and output nodes for the circuitry embedded in device 720. In addition, leads 724, 726 may be electrically coupled to conductive structures 712, 714 at the top surface of the system substrate 710, as shown.

As with the embodiment of the system 600 of FIG. 6, device substrate 722 and leads 724, 726 may form portions of a leadframe, which holds the device substrate 722 and leads 724, 726 in fixed orientations with respect to each other, prior to encapsulation. Although straight leads 724, 726 that are co-planar with the device substrate 722 are illustrated in FIG. 7, gull wing leads or leads with other shapes alternatively may be used. In addition, the leads may not be co-planar with the device substrate, in alternate embodiments.

As also illustrated in FIG. 7, circuitry may be physically coupled to the top surface 772 of the encapsulation 770, and electrically coupled to the leads 724, 726 and to circuitry embedded in device 720 through top terminations 761-764. As discussed previously, the first and second circuitry 790, 792 may include any of a variety of electrical components that are suitable for being formed on or attached to the top surface 772 of the encapsulation 770.

Figure 8:
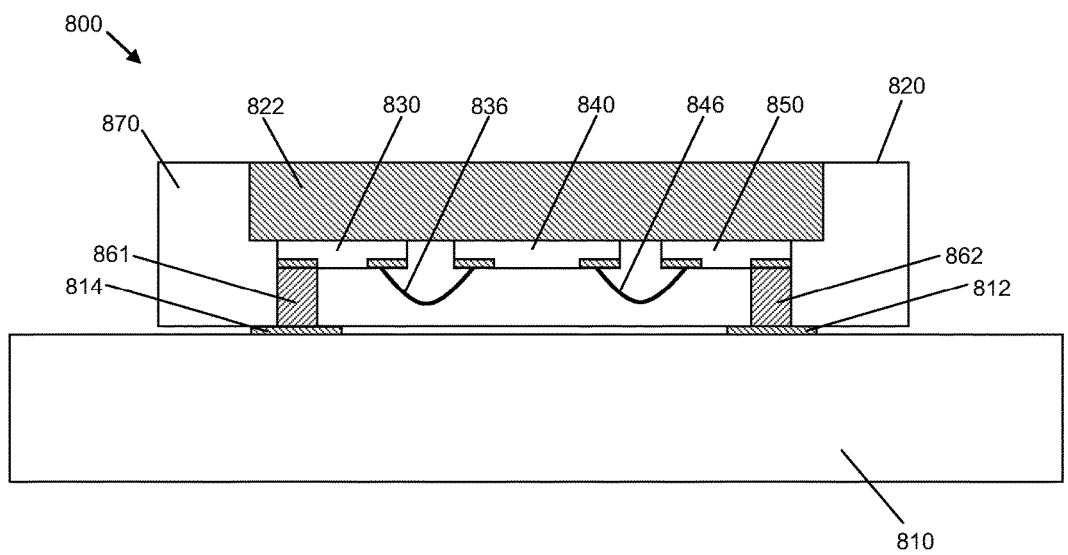

In each of the embodiments of FIGS. 3-7, the electronic device 300, 400, 500, 600, 700 is coupled to a system substrate 310, 410, 510, 610, 710 with the top terminations facing upward, thus facilitating attachment of additional circuitry to the top surface of the devices. In an alternate embodiment, an electronic device may include top terminations that are directly coupled to a system substrate (i.e., the top terminations are facing downward). For example, FIG. 8 is a cross-sectional, side view of a system 800 that includes a system substrate 810 (e.g., a PCB) to which an electronic device 820 with top terminations 861, 862 is coupled, in accordance with yet another example embodiment. Similar to the devices 300, 500, 600 of FIGS. 3, 5, and 6, device 820 includes a substrate 822, a plurality of die 830, 840, 850, wirebonds 836, 846, the top terminations 861, 862, and encapsulation 870. The characteristics and functionality of each of these components may be identical or substantially similar to the analogous components in devices 300, 500 of FIGS. 3 and 5. For brevity, those characteristics and functionality will not be repeated.

The system 800 of FIG. 8 differs from the systems 300, 500, 600 of FIGS. 3, 5, and 6, in that the device 820 is flipped upside down, and top terminations 861, 862 are directly coupled to conductive structures 812, 814 at the top surface of the system substrate 810, as shown. Accordingly, the exposed surfaces of top terminations 861, 862 function as input and output nodes for the circuitry embedded in device 820.

In the device 820 of FIG. 8, the device substrate 822 is not in contact with the system substrate 810. In an embodiment in which the device substrate 822 functions as a heatsink for the device 820, additional thermally-conducting structures (not shown) may be coupled to the device substrate 822 to serve as a conduit for removing heat from device substrate 822.

Figure 9:
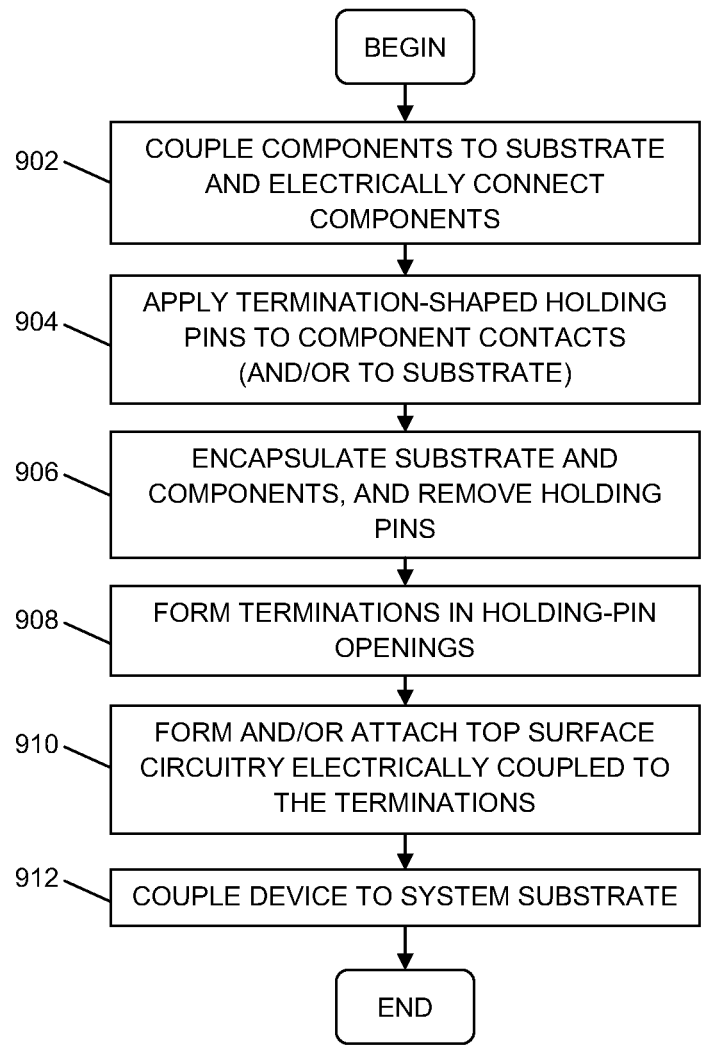
FIG. 9 is a flowchart of a method of manufacturing an electronic device with one or more top terminations, in accordance with an example embodiment.

FIG. 9 is a flowchart of a method of manufacturing an electronic device (e.g., electronic devices 200, 320, 420, 520, 620, 720, 820, FIGS. 2-8) with one or more top terminations (e.g., top terminations 261-265, 361, 362, 461, 462, 561-564, 661-664, 761-764, 861, 862, FIGS. 2-8), in accordance with an example embodiment. FIG. 9 should be viewed in parallel with FIGS. 10-13, which are cross-sectional, side views of an electronic device at various stages of manufacture consistent with the method of FIG. 9, and in accordance with an example embodiment.

Figure 10:
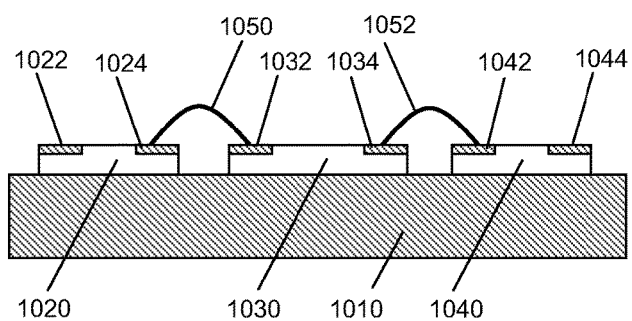
FIGS. 10-13 are cross-sectional, side views of an electronic device at various stages of manufacture, in accordance with an example embodiment.

Referring also to FIG. 10, the method may begin, in block 902, by providing a device substrate 1010. As discussed in detail previously, the substrate 1010 may have a conductive top surface, which provides a voltage reference node (e.g., a ground node) for the device. In some embodiments (e.g., when the substrate is a BGA substrate), power and signals also may be communicated through the conductive top surface. When manufacturing embodiments of devices that also include leads (e.g., devices 600, 700, FIGS. 6, 7), provision of the substrate also may include provision of the leads, where the substrate and the leads form portions of a leadframe. Block 902 also includes coupling one or more circuit components 1020, 1030, 1040 to the top surface of the substrate 1010, and electrically coupling the circuit components 1020, 1030, 1040 (e.g., using wirebonds 1050, 1052). Coupling the circuit components 1020, 1030, 1040 may be performed using any of a number of component or die attach methods. In some embodiments, the circuit components 1020, 1030, 1040 may be coupled to the substrate 1010 using a conductive material (e.g., solder, conductive epoxy, a sinterable material, and so on). In other embodiments, the circuit components 1020, 1030, 1040 may be coupled to the substrate 1010 using a non-conductive material.

The circuit components 1020, 1030, 1040 may include discrete components and/or integrated circuit die. For example, circuit component 1020 may be an input-side die that includes one or more components of an input impedance matching circuit and conductive die pads 1022, 1024, circuit component 1030 may be a transistor die that includes one or more transistors and conductive die pads 1032, 1034, and circuit component 1040 may be an output-side die that includes one or more components of an output impedance matching circuit and conductive die pads 1042, 1044. Wirebonds 1050, 1052 may form inductive portions of the input and output impedance matching circuits, respectively.

The assembly then may be placed within an opening of a mold (not shown), where the shape of the mold opening is consistent with the ultimate shape of encapsulation (e.g., encapsulation 1180), which is formed a subsequent manufacturing stage (i.e., block 906).

Figure 11:
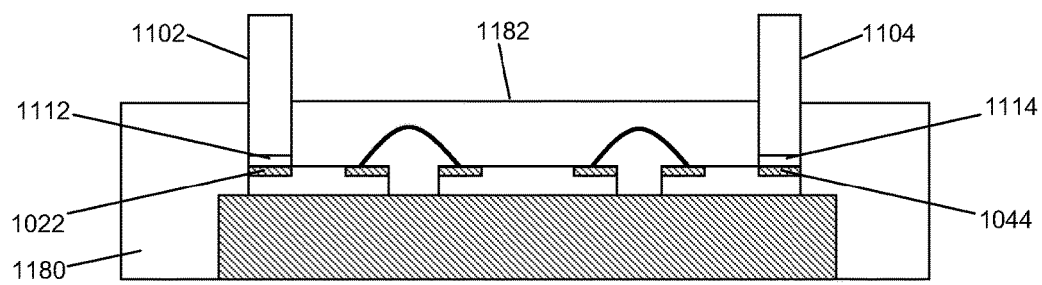

Referring also to FIG. 11, in block 904, holding pins 1102, 1104 are non-permanently applied to areas to which top terminations (e.g., top terminations 1310, 1312, FIG. 13) ultimately will be coupled. Prior to applying the holding pins 1102, 1104, the holding pins 1102, 1104 may be surrounded by a compliant ductile film or coating (not shown), or the ductile film or coating may be applied just to the bottoms of the holding pins 1102, 1104. Alternatively, a ductile film or coating 1112, 1114 may be applied over the areas that the holding pins 1102, 1104 will contact (e.g., over die pads 1022, 1044) in order to protect those areas from damage that may otherwise occur if the holding pins 1102, 1104 were brought into direct contact with those areas. According to an embodiment, the holding pins 1102, 1104 have shapes that are consistent with the ultimate shapes of the top terminations (e.g., top terminations 1310, 1312, FIG. 13). For example, holding pins 1102, 1104 are brought into contact with conductive die pads 1022 and 1044, and have shapes that are consistent with the shapes of top terminations (e.g., top terminations 1310, 1312, FIG. 13), which will be formed in contact with die pads 1022, 1044 at a later manufacturing stage (i.e., in block 908). One or more holding pins (not shown) also or alternatively may be brought into contact with the top surface of the device substrate 1010.

In block 906, the substrate 1010 and the circuit components (including components 1020, 1030, 1040 and wirebonds 1050, 1052) are encapsulated with the holding pins in place. For example, the encapsulation process may include applying molding compound within the mold opening so that the molding compound substantially surrounds the circuit components and at least the top surface of the device substrate 1010, and curing the molding compound to render the encapsulation 1180 rigid. In various embodiments, application of the encapsulation 1180 could include transfer molding, injection molding, pouring, or any other suitable method. At this point, the circuit components are embedded below a top surface 1182 of the encapsulation 1180.

Figure 12:
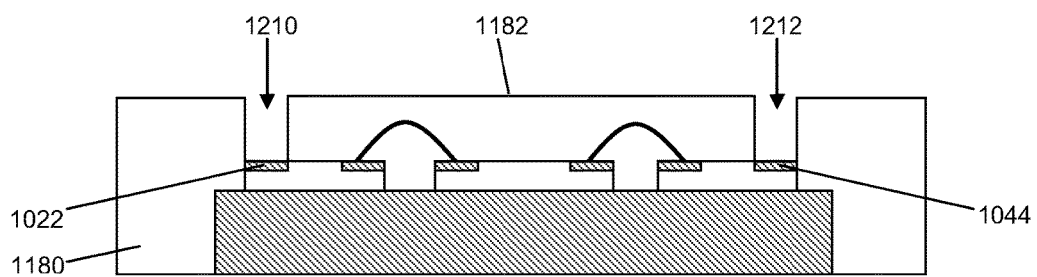

Referring to FIG. 12, the holding pins are then removed (along with any protective ductile film 1112, 1114 or coating on the holding pins and/or die pads 1022, 1044). Any protective ductile film 112, 114 or coating may pull out with the holding pins, may be removed mechanically after the holding pins are removed, or may be dissolved or otherwise chemically removed after the holding pins are removed. This results in an assembly that includes openings 1210, 1212 in the encapsulation 1180, where the openings 1210, 1212 have shapes that are consistent with the shapes of top terminations (e.g., top terminations 1310, 1312, FIG. 13) that will be formed in contact with die pads 1022, 1044 in the next manufacturing stage (i.e., in block 908). The openings 1210, 1212 extend from the top surface 1182 of the encapsulation 1180 to portions of circuit components to which the top terminations will be coupled (e.g., die pads 1022, 1044). At this stage, those portions of the circuit components exposed at the bottoms of openings 1210, 1212.

Figure 13:
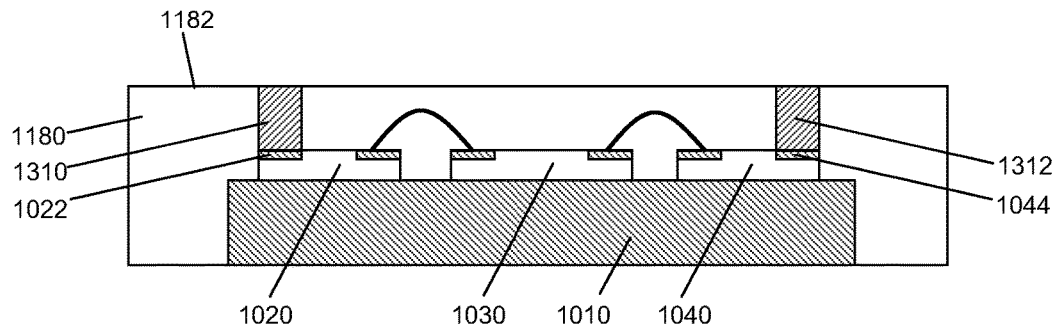

Referring to FIG. 13, top terminations 1310, 1312 are then formed in the openings 1210, 1212, in block 908, so that the top terminations 1310, 1312 are physically and electrically coupled to the die pads 1022, 1044 (and/or to substrate 1010 and/or other components or die pads). The top terminations could be formed using any of several suitable processes. For example, in one embodiment, bulk conductive material (e.g., a thick film conductive paste, a conductive polymer, a sintered silver paste, and other suitable materials) could be deposited directly within the openings in the encapsulation to fill the openings and to form the top terminations.

In other embodiments, plating and conductive material deposition processes may be performed to form top terminations, where the processes and conductive materials used may depend on the material (e.g., aluminum, copper, copper/aluminum, nickel, palladium, gold, and so on) of the conductive feature to which the top terminations are coupled. For example, formation of a top termination may include performing an activation process to the conductive feature on which the top termination will be formed in order to facilitate plating. More specifically, for example, a zinc activation process may be performed on an aluminum feature, a palladium activation process may be performed on a copper feature, and so on.

A plating process may thereafter be performed. For example, the plating process may include electroless or electrolytic nickel plating, copper plating, copper/nickel plating, or other plating materials/processes. The process may further include forming the conductive bulk of the top termination. For example, forming the conductive bulk of the top termination may include performing an immersion process (e.g., immersion tin), performing multiple plating processes (e.g., using nickel, copper, tin, and/or other materials), and/or performing other conductive bulk formation processes. A final conductive layer (e.g., tin, copper, and so on) may be formed on a top surface of the top termination. In addition, in some embodiments, solder may be applied (e.g., screen printed or otherwise applied) to the top surface of the top termination to facilitate later connection of external additional circuitry to the top termination.

Other methods for forming the top terminations 1310, 1312 alternatively could be employed. For example, the top terminations 1310, 1312 could be formed using sputtering and/or evaporation processes, plasma spraying, and other suitable methods.

Additional conductive features (e.g., conductive features 380, 382, 480, 482, 580, 582, FIGS. 3-5) also may be formed on one or more surfaces of the encapsulation 1180. The additional conductive features may be used in subsequent manufacturing stages (e.g., in blocks 910, 912) to electrically couple circuitry within the device to circuitry that is external to the device.

In block 910, additional circuitry (e.g., first and second circuitry 390, 392, 490, 492, 590, 592, 690, 692, 790, 792, FIGS. 3-7) may then be formed on or attached to the top surface 1182 of the encapsulation 1180, and electrically coupled to the top terminations 1310, 1312. As discussed previously, the additional circuitry may include discrete electrical components (e.g., capacitors, inductors, resistors, and so on), integrated circuit die, transmission lines, small PCBs, passive components of input and/or output impedance matching circuits, bias circuitry, phase shifters, attenuators, power dividers, power combiners, processing components, and so on. In other embodiments, no additional circuitry is formed on or attached to the top surface 1182 of the encapsulation 1180 (e.g., as in the embodiment of FIG. 8), and block 910 may be excluded.

In block 912, the device may be coupled to a system substrate (e.g., a PCB, such as substrate 210, 310, 410, 510, 610, 710, 810, FIGS. 2-8). For example, in some embodiments (e.g., the embodiments of FIGS. 3-7), the device may be coupled to a system substrate with the device substrate 1010 in contact with the system substrate and the top terminations 1310, 1312 (and additional circuitry, if attached) facing upward. In embodiments in which the device substrate 1010 functions as a heatsink, this may include coupling the device substrate 1010 to a conductive feature of the system substrate (e.g., a conductive coin or other feature). In other embodiments (e.g., the embodiment of FIG. 8), the device may be coupled to a system substrate with the top terminations 1310, 1312 directly in contact with and electrically coupled to conductive features (e.g., conductive features 812, 814, FIG. 8) of the system substrate. Either way, coupling the device to the system substrate functions to incorporate the device into a larger electrical system.

Figure 14:
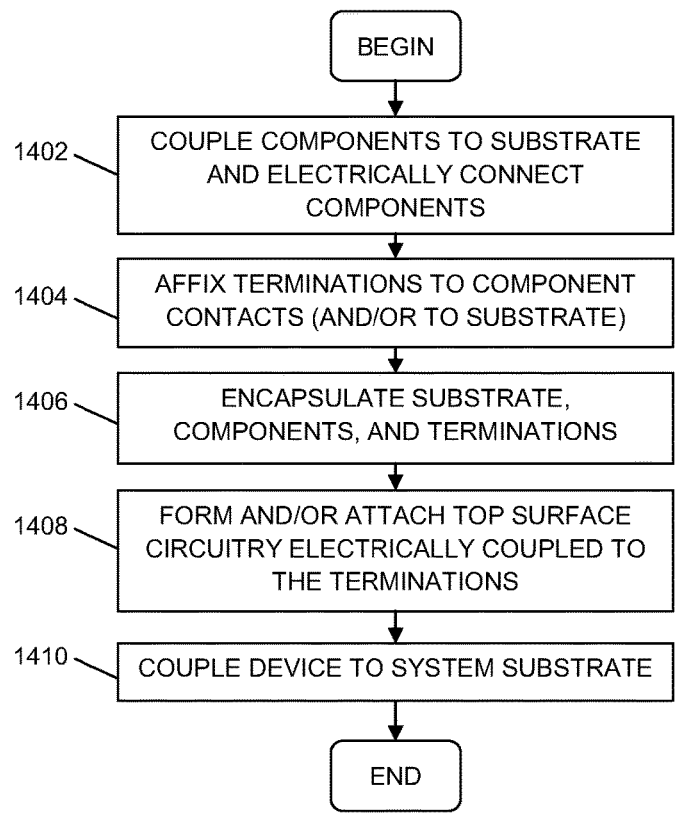
FIG. 14 is a flowchart of a method of manufacturing an electronic device with one or more top terminations, in accordance with another example embodiment.

FIG. 14 is a flowchart of a method of manufacturing an electronic device (e.g., electronic devices 200, 320, 420, 520, 620, 720, 820, FIGS. 2-8) with one or more top terminations (e.g., top terminations 261-265, 361, 362, 461, 462, 561-564, 661-664, 761-764, 861, 862, FIGS. 2-8), in accordance with another example embodiment. FIG. 14 should be viewed in parallel with FIGS. 15 and 16, which are cross-sectional, side views of an electronic device at various stages of manufacture consistent with the method of FIG. 14, and in accordance with an example embodiment.

Figure 15:
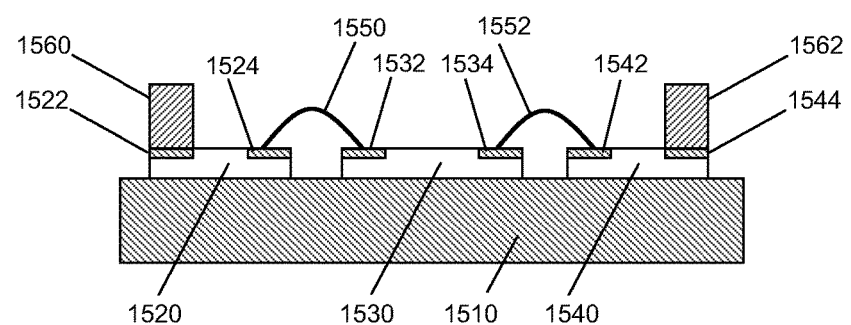
FIGS. 15 and 16 are cross-sectional, side views of an electronic device at various stages of manufacture, in accordance with another example embodiment.

Referring also to FIG. 15, the method may begin, in block 1402, by providing a device substrate 1510, coupling one or more circuit components 1520, 1530, 1540 to the top surface of the substrate 1510, and electrically coupling the circuit components 1520, 1530, 1540 (e.g., using wirebonds 1550, 1552). These processes and variations thereof may be substantially similar to the processes and variations described above with respect to block 902 of FIG. 9, and those details will not be repeated here for brevity.

The assembly then may be placed within an opening of a mold (not shown), where the shape of the mold opening is consistent with the ultimate shape of encapsulation (e.g., encapsulation 1680), which is formed a subsequent manufacturing stage (i.e., block 1406).

In block 1404, top terminations 1560, 1562 are permanently affixed to desired contact points on the components 1520, 1530, 1540 and/or the top surface of the device substrate 1510. The top terminations 1560, 1562 are solid conductive structures, which may be formed from a number of conductive materials (e.g., copper, aluminum, tin, and so on). The top terminations 1560, 1562 may be affixed to the contact points (e.g., to die pads 1522 and 1544, as shown) using solder, conductive epoxy, brazing, sintering, or using other materials and/or methods.

Figure 16:
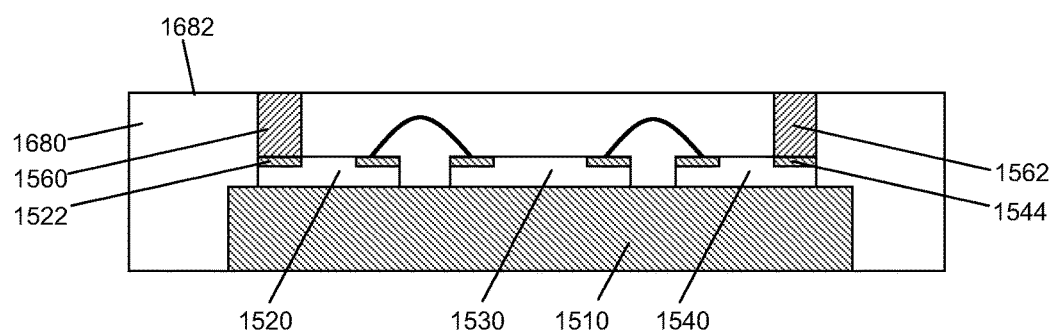

Referring also to FIG. 16, in block 1406, the substrate 1510, the circuit components (including components 1520, 1530, 1540 and wirebonds 1550, 1552), and the top terminations 1560, 1562 are encapsulated. For example, the encapsulation process may include applying molding compound within the mold opening so that the molding compound substantially surrounds the circuit components, at least the top surface of the device substrate 1510, and at least the sides of the top terminations 1560, 1562, and curing the molding compound to render the encapsulation 1680 rigid. At this point, the circuit components are embedded below a top surface 1682 of the encapsulation 1680. An encapsulation removal process may be performed to expose the top surfaces of the top terminations 1560, 1562, and to make the top surfaces of the top terminations 1560, 1562 substantially co-planar with the top surface 1682 of the encapsulation 1680.

Additional conductive features (e.g., conductive features 380, 382, 480, 482, 580, 582, FIGS. 3-5) also may be formed on one or more surfaces of the encapsulation 1680. The additional conductive features may be used in subsequent manufacturing stages (e.g., in blocks 1408, 1410) to electrically couple circuitry within the device to circuitry that is external to the device.

In block 1408, additional circuitry (e.g., first and second circuitry 390, 392, 490, 492, 590, 592, 690, 692, 790, 792, FIGS. 3-7) may then be formed on or attached to the top surface 1682 of the encapsulation 1680, and electrically coupled to the top terminations 1560, 1562. As discussed previously, the additional circuitry may include discrete electrical components (e.g., capacitors, inductors, resistors, and so on), integrated circuit die, transmission lines, small PCBs, passive components of input and/or output impedance matching circuits, bias circuitry, phase shifters, attenuators, power dividers, power combiners, processing components, and so on. In other embodiments, no additional circuitry is formed on or attached to the top surface 1682 of the encapsulation 1680 (e.g., as in the embodiment of FIG. 8), and block 1408 may be excluded.

In block 1410, the device may be coupled to a system substrate (e.g., a PCB, such as substrate 210, 310, 410, 510, 610, 710, 810, FIGS. 2-8). For example, in some embodiments (e.g., the embodiments of FIGS. 3-7), the device may be coupled to a system substrate with the device substrate 1510 in contact with the system substrate and the top terminations 1560, 1562 (and additional circuitry, if attached) facing upward. In embodiments in which the device substrate 1510 functions as a heatsink, this may include coupling the device substrate 1510 to a conductive feature of the system substrate (e.g., a conductive coin or other feature). In other embodiments (e.g., the embodiment of FIG. 8), the device may be coupled to a system substrate with the top terminations 1560, 1562 directly in contact with and electrically coupled to conductive features (e.g., conductive features 812, 814, FIG. 8) of the system substrate. Either way, coupling the device to the system substrate functions to incorporate the device into a larger electrical system.

It is to be understood that the various steps discussed in conjunction with FIGS. 9 and 14 may be performed in orders other than the orders depicted in FIGS. 9 and 14. In addition, although FIGS. 9-16 describe and depict formation of a device that is substantially similar to device 320, FIG. 3, the processes may be modified to form devices that are substantially similar to any of the devices depicted in the figures (e.g., to devices depicted in FIG. 1, 2, or 4-8. The processes also may be used to form devices that include substantially different circuitry from that which is discussed above, as well. Further, the processes may be modified to form devices that are implemented in FOWL packages. For example, rather than coupling the components to a substrate before encapsulation, the components may be coupled to a temporary support structure and overmolded. The temporary support structure may thereafter be removed, and a plurality of conductive routing layers and intervening dielectric layers (i.e., the "substrate") may be built up on contact surfaces of the components that are exposed through the encapsulation. In such an embodiment, the encapsulation may be formed with openings within which conductive terminations later will be formed (e.g., as in the method of FIG. 9), or the conductive terminations may be coupled to the components or to the temporary support structure prior to encapsulation (e.g., as in the method of FIG. 14). All such modifications are intended to be included within the scope of the inventive subject matter.

Various embodiments of electronic devices and methods of their manufacture have been described above. An embodiment of a device includes a substrate and a first component of a first circuit coupled to a top surface of the substrate. The first component has a component top surface, and the first component includes a conductive feature on the component top surface. The device also includes encapsulation having an encapsulation top surface over at least a portion of the substrate top surface and the component top surface. The encapsulation includes an opening extending from the encapsulation top surface to the conductive feature of the first component. The device also includes a first conductive termination structure within the opening in the encapsulation, where the first conductive termination structure extends from the conductive feature to the encapsulation top surface. According to a further embodiment, the device also includes a second circuit physically coupled to the encapsulation top surface and electrically coupled to the first component through the first conductive termination structure.

Another embodiment of a device includes a substrate and first and second circuits coupled to the substrate top surface. The first circuit includes a first set of electrical components, and the second circuit includes a second set of electrical components. The device also includes encapsulation having a top encapsulation surface over at least a portion of the substrate top surface and the first and second circuits. The encapsulation includes a trench-shaped opening extending from the encapsulation top surface into the encapsulation toward the substrate top surface, and the trench-shaped opening is positioned between the first and second circuits. The device also includes a conductive termination structure within the trench-shaped opening. The conductive termination structure is configured to reduce electromagnetic coupling between the first circuit and the second circuit during operation of the first circuit and the second circuit. According to a further embodiment, the first circuit forms a portion of a first amplifier of a multiple-path amplifier, the second circuit forms a portion of a second amplifier of the multiple-path amplifier, and the conductive termination structure is configured to reduce electromagnetic coupling between the first amplifier and the second amplifier. According to another further embodiment the first circuit includes an input to an amplifier, the second circuit includes an output of the amplifier, and the conductive termination structure is configured to reduce electromagnetic coupling between the input and the output during an operation of the first circuit and the second circuit.

An embodiment of a method of manufacturing an electronic device includes coupling an electrical component to a top surface of a substrate, where the electrical component has a conductive feature on a top surface of the electrical component. The method further includes forming encapsulation over the electrical component and the top surface of the substrate, and providing a top termination through the encapsulation between the conductive feature and a top surface of the encapsulation.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the foregoing detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of manufacturing an electronic device, the method comprising the steps of:
    coupling a transistor of an amplifier circuit to a surface of a substrate, wherein the transistor has a first die pad at a transistor top surface;
    coupling a first conductive termination structure to the first die pad;
    after coupling the first conductive termination structure to the first die pad, forming an encapsulation having an encapsulation top surface over at least a portion of the surface of the substrate and the transistor top surface, wherein the first conductive termination structure extends from the first die pad through the encapsulation to the encapsulation top surface;
    and
    physically coupling a second circuit that forms a portion of the amplifier circuit to the encapsulation top surface, wherein the second circuit is electrically coupled to the transistor through the first conductive termination structure.

2. The method of claim 1, wherein the first conductive termination structure is a solid conductive structure that is directly physically coupled to the first die pad of the transistor.

3. The method of claim 1, wherein an entirety of the first conductive termination structure is formed from a bulk conductive material.

4. The method of claim 3, wherein the bulk conductive material is selected from a thick film conductive paste, a conductive polymer, and a sintered paste.

5. The method of claim 1, further comprising:
    providing a second conductive termination structure extending from a second die pad of the transistor to the encapsulation top surface.

6. The method of claim 1, wherein the surface of the substrate is conductive, and the method further comprises:
    providing a second conductive termination structure that extends from the surface of the substrate to the encapsulation top surface.

7. The method of claim 1, wherein coupling the first conductive termination structure comprises:
    prior to forming the encapsulation, permanently affixing the first conductive termination structure to the first die pad exposed at the transistor top surface.

8. A method of manufacturing an electronic device, the method comprising the steps of:

coupling a transistor of an amplifier circuit to a surface of a substrate, wherein the transistor has a transistor top surface;

forming an encapsulation having an encapsulation top surface over at least a portion of the surface of the substrate and the transistor top surface, wherein forming the encapsulation includes
  applying a termination-shaped holding pin to a first die pad exposed at the transistor top surface,
  forming the encapsulation in contact with the termination-shaped holding pin, and over the at least a portion of the surface of the substrate and the transistor top surface, and
  after forming the encapsulation, removing the termination-shaped holding pin from the first die pad, wherein the encapsulation includes an opening where the termination-shaped holding pin was located that extends from the encapsulation top surface toward the transistor, and wherein the first die pad is exposed at a bottom of the opening;

providing a first conductive termination structure within the opening in the encapsulation; and physically coupling a second circuit that forms a portion of the amplifier circuit to the encapsulation top surface, wherein the second circuit is electrically coupled to the transistor through the first conductive termination structure.

9. The method of claim 8, wherein an entirety of the first conductive termination structure includes plated metal in direct contact with the first die pad, and a conductive bulk over the plated metal.

10. The method of claim 8, wherein providing the first conductive termination structure comprises:
  forming the first conductive termination structure in the opening in the encapsulation.

11. A method of manufacturing an electronic device, the method comprising the steps of:
  coupling a transistor of an amplifier circuit to a surface of a substrate, wherein the transistor has a transistor top surface, and wherein the transistor includes a first die pad exposed at the transistor top surface;
  coupling a first conductive termination structure to the first die pad;
  forming an encapsulation having an encapsulation top surface over at least a portion of the surface of the substrate, sides of the first conductive termination structure, and the transistor top surface, wherein the first conductive termination structure extends from the first die pad to the encapsulation top surface; and
  physically coupling a second circuit that forms a portion of the amplifier circuit to the encapsulation top surface, wherein the second circuit is electrically coupled to the transistor through the first conductive termination structure.

12. The method of claim 11, wherein the first conductive termination structure is a solid conductive structure that is directly physically coupled to the first die pad.

13. The method of claim 11, wherein an entirety of the first conductive termination structure from the first die pad to the encapsulation top surface is formed from a bulk conductive material.

14. The method of claim 13, wherein the bulk conductive material is selected from a thick film conductive paste, a conductive polymer, and a sintered paste.

15. The method of claim 11, further comprising:
  providing a second conductive termination structure extending from a second die pad of the transistor to the encapsulation top surface.

16. The method of claim 11, wherein the surface of the substrate is conductive, and the method further comprises:
  providing a second conductive termination structure that extends from the surface of the substrate to the encapsulation top surface.

17. The method of claim 11, wherein providing the first conductive termination structure comprises:
  prior to forming the encapsulation, permanently affixing the first conductive termination structure to the first die pad.

18. The method of claim 11, wherein the second circuit includes one or more components of an input impedance matching circuit.

19. The method of claim 11, wherein the second circuit includes one or more components of an output impedance matching circuit.

20. A method of manufacturing an electronic device, the method comprising the steps of:
  coupling a transistor of an amplifier circuit to a surface of a substrate, wherein the transistor has a transistor top surface, and wherein the transistor includes a first die pad exposed at the transistor top surface;
  forming an encapsulation having an encapsulation top surface over at least a portion of the surface of the substrate and the transistor top surface, wherein the encapsulation includes an opening extending from the encapsulation top surface to the first die pad of the transistor, and wherein forming the encapsulation includes
    applying a termination-shaped holding pin to the first die pad,
    forming the encapsulation in contact with the termination-shaped holding pin, and over the at least a portion of the surface of the substrate and the transistor top surface, and
    after forming the encapsulation, removing the termination-shaped holding pin from the first die pad, wherein the encapsulation includes the opening where the termination-shaped holding pin was located, and wherein the first die pad is exposed at a bottom of the opening;
  providing a first conductive termination structure within the opening in the encapsulation, wherein the first conductive termination structure extends from the first die pad to the encapsulation top surface; and
  physically coupling a second circuit that forms a portion of the amplifier circuit to the encapsulation top surface, wherein the second circuit is electrically coupled to the transistor through the first conductive termination structure.

21. The method of claim 20, wherein an entirety of the first conductive termination structure from the first die pad to the encapsulation top surface includes plated metal in direct contact with the first die pad, and a conductive bulk over the plated metal.

22. The method of claim 20, wherein providing the first conductive termination structure comprises:
  forming the first conductive termination structure in the opening in the encapsulation.

* * * * *